(12) United States Patent
Takato et al.

(10) Patent No.: US 6,692,981 B2
(45) Date of Patent: Feb. 17, 2004

(54) METHOD OF MANUFACTURING A SOLAR CELL

(75) Inventors: Hidetaka Takato, Tsukuba (JP); Ryuichi Shimokawa, Ushiku (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 09/961,142

(22) Filed: Sep. 24, 2001

(65) Prior Publication Data

US 2002/0036011 A1 Mar. 28, 2002

(30) Foreign Application Priority Data

Sep. 25, 2000 (JP) ........................... 2000-290003

(51) Int. Cl.⁷ ........................... H01L 21/00; H01L 21/30
(52) U.S. Cl. ..................... 438/57; 438/87; 438/89; 438/97; 438/458
(58) Field of Search .................. 438/57, 66, 977, 438/67, 458, 96, 97, 98

(56) References Cited

U.S. PATENT DOCUMENTS 6,184,056 B1 * 2/2001 Nakamura et al. .......... 257/447
6,190,937 B1 * 2/2001 Nakagawa et al. .......... 438/458
6,201,260 B1 * 3/2001 Suzuki et al. ................. 257/66

FOREIGN PATENT DOCUMENTS

| JP | 53-130974 | * 11/1978 | ........... H01L/21/20 |
| JP | 4-88642 | 3/1992 | |
| JP | 7-263340 | 10/1995 | |

OTHER PUBLICATIONS

Quirk et al., Semiconductor Manufacturing Technology (2001), Prentice Hall, p. 479.*

* cited by examiner

*Primary Examiner*—Carl Whitehead, Jr.
*Assistant Examiner*—David L. Hogans
(74) *Attorney, Agent, or Firm*—Oblon, Spivak, McClelland, Maier & Neustadt, P.C.

(57) ABSTRACT

A method of manufacturing a solar cell comprises interposing an intermediate layer containing p-type or n-type impurity between a silicon thin film and a support substrate, and heating all or part of the structure thus formed to a temperature at which the impurity contained in the intermediate layer diffuses into the silicon thin film, forming a high-concentration impurity layer in the silicon thin film.

5 Claims, 2 Drawing Sheets

METHOD OF MANUFACTURING A SOLAR CELL

BACKGROUND OF THE INVENTION

1. Field of the Invention

The present invention relates to a method of manufacturing a solar cell having a silicon layer comprised of a silicon thin film, and more particularly to a method of manufacturing a solar cell of crystalline silicon thin film.

2. Description of the Prior Art

In a solar cell comprised of single-crystal or polycrystal silicon thin film, the silicon layer that generates electricity is thin, having a thickness ranging from several microns to several tens of microns, which is not enough to support itself like a cast substrate can that is in the order of 300 microns thick. It therefore requires some sort of support substrate.

Therefore, in fabricating such a solar cell, it is necessary to directly deposit a silicon film on the support substrate by a method such as chemical vapor deposition (CVD), or to bond a silicon film that has been fabricated on another substrate or a silicon thin-film solar cell that has been fabricated on another substrate onto the required support substrate.

The silicon thin film can be bonded onto the support substrate by various methods such as a method comprising forming a layer of single-crystal on a layer of porous silicon formed on a silicon substrate, and after the solar cell has been fabricated, adhering the solar cell to the support substrate, then separating and removing the silicon substrate, or a method comprising forming a silicon thin film on an oxide layer formed on the silicon substrate, adhering it to the required support substrate, then separating and removing the silicon substrate.

To improve the energy conversion efficiency, a high-concentration impurity layer is formed on the back surface of the solar cell to produce a field effect that prevents recombination of minority carriers. This is referred to as a back surface field (BSF) structure.

However, there are problems with the prior art methods of adhering a silicon film to a support substrate. For example, a high-concentration diffusion layer has to be formed prior to the bonding step, but limitations on the control of the diffusivity concentration and diffusion depth make it difficult to form the high-concentration diffusion layer. Moreover, when the silicon film is going to be directly deposited onto the support substrate, first a high-concentration diffusion layer is deposited, and then the predetermined silicon film is formed, so the procedure is a complicated one. In the case of the prior art manufacturing methods described above, it is difficult to precisely control the formation of the high-concentration impurity diffusion layer required for the BSF structure.

The object of the present invention is to provide a method of manufacturing a solar cell that enables the high-concentration impurity diffusion layer to be formed with good precision, simplifies the manufacturing steps and improves the photoelectric conversion efficiency.

SUMMARY OF THE INVENTION

To attain the above object, the present invention provides a method of manufacturing a solar cell comprising interposing an intermediate layer containing p-type or n-type impurity between a silicon thin film and a support substrate, and subjecting all or part of the structure thus formed to heat treatment at 500° C. to 1500° C. to diffuse the intermediate layer impurity into the silicon thin film to form a high-concentration impurity layer in the silicon thin film.

The silicon of the silicon thin film may be single-crystal silicon or polycrystal silicon.

The impurity in the intermediate layer may be a group III element such as boron or aluminum or a compound thereof such as boron oxide, or a group V element such as phosphorus, antimony or a compound thereof such as phosphorus oxide.

The silicon thin film may be formed directly on the intermediate layer, or a silicon thin film formed on a thin silicon substrate or other substrate may be adhered to the intermediate layer.

Since the method of manufacturing a solar cell according to the present invention employs a step of forming a high-concentration impurity layer in the silicon thin film by heat-treating an intermediate layer that contains the impurity, it is not necessary to diffuse a high-concentration impurity layer before adhering the silicon thin film, so the manufacturing procedure is simplified.

Moreover, the concentration and diffusion depth of the impurity diffusion layer can be controlled with good precision by adjusting the impurity concentration of the intermediate layer, the temperature at which heat treatment is effected and the length of the heat treatment.

Also, since the high-concentration impurity diffusion layer can thus be formed with good precision, it is possible to effectively control the recombination of minority carriers, making it possible to provide solar cells having improved photoelectric conversion efficiency. Furthermore, without any additional processes it is also possible to form a back side field layer or back side electrode layer, which also helps to increase the efficiency of the solar cells.

Further features of the invention, its nature and various advantages will be more apparent from the accompanying drawings and following detailed description of the invention.

DESCRIPTION OF THE PREFERRED EMBODIMENTS

Figure 1A:
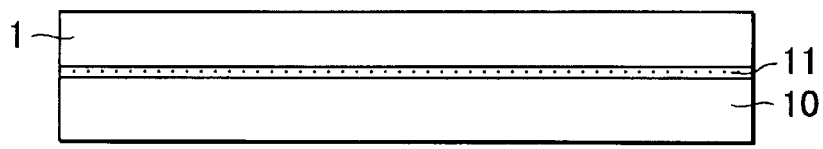
FIGS. 1(a) to (f) show the steps of the method of manufacturing a solar cell according to a first embodiment of the invention.

The method of manufacturing a solar cell of this invention comprises interposing an intermediate layer containing p-type or n-type impurity between a silicon thin film (silicon layer) and a support substrate, forming a sandwich structure, and subjecting all or part of the sandwich structure to heat treatment at 500° C. to 1500° C. to diffuse the intermediate layer impurity into the silicon thin film to form a high-concentration impurity layer in the silicon thin film.

The preferred concentration of the high-concentration impurity layer is $1 \times 10^{18}$ to $1 \times 10^{21}$ cm$^{-3}$, and the preferred diffusion depth in the silicon thin film is one that is within the range 0.1 to 1 $\mu$m.

The silicon thin film can be a single-crystal or polycrystal silicon layer or thin silicon substrate that is up to 100 $\mu$m thick, formed directly on the intermediate layer on the support substrate by the CVD method. Or, a silicon layer or thin silicon substrate formed on another substrate can be bonded onto the intermediate layer with an adhesive or the like. The intermediate layer can be formed on the support substrate by using the CVD method to form an impurity-containing oxide layer. The intermediate layer containing an impurity element or compound can be dissolved in an organic solvent and the solution can be coated on the support substrate.

The above-mentioned impurity may be a group III element such as boron or aluminum or a compound thereof such as boron oxide, or a group V element such as phosphorus, antimony or a compound thereof such as phosphorus oxide. The concentration and diffusion depth of the impurity in the silicon thin film can be controlled by adjusting the impurity concentration of the intermediate layer, the temperature at which heat treatment is effected and the length of the heat treatment.

For the intermediate layer, there may be used silica glass or another glass containing the above elements or compounds thereof, inorganic adhesive containing alkaline metal silicate, a silicon oxide layer or a silicon nitride layer.

For the support substrate, it is desirable to use a material having an expansion coefficient close to that of silicon. A ceramic substrate, a substrate of silica glass or other glass, a metal substrate with a high melting point, or a ceramic or glass substrate on which is formed a silicon oxide layer, a silicon nitride layer or a high-melting-point metal. The diffusion reflectivity can be improved by roughening the support substrate surface beforehand.

The steps of manufacturing a solar cell according to the present invention will now be described with reference to the drawings.

FIG. 1 shows the steps of the method of manufacturing a solar cell according to a first embodiment of the invention, by adhering a silicon thin film to a support substrate. With reference to FIG. 1(a), a porous silicon layer 11 is formed on a silicon substrate 10, and a silicon thin film 1 is formed on the porous silicon layer 11, by a chemical vapor deposition method.

Figure 1B:
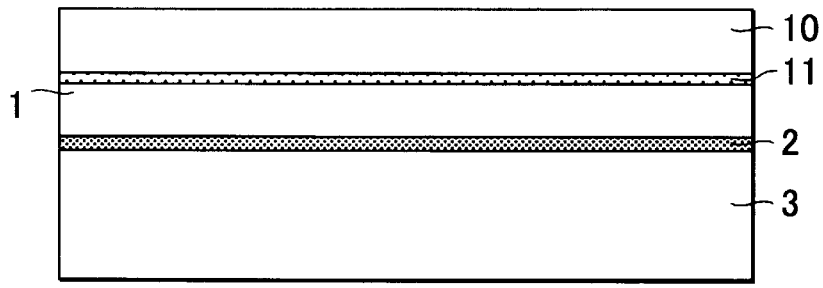

A solution of boron-containing silica glass mixed with an organic solvent is coated on a ceramic support substrate 3 and baked at 300° C. to 500° C. to remove resin included in the coating. Then, as shown in FIG. 1(b), the silicon thin film 1 is placed on a silica glass layer. The silica glass layer becomes intermediate layer 2. Instead of silica glass, the CVD method can be used to form a boron-containing oxide film on the ceramic support substrate 3, and the silica thin film 1 can be placed on that.

Figure 1C:
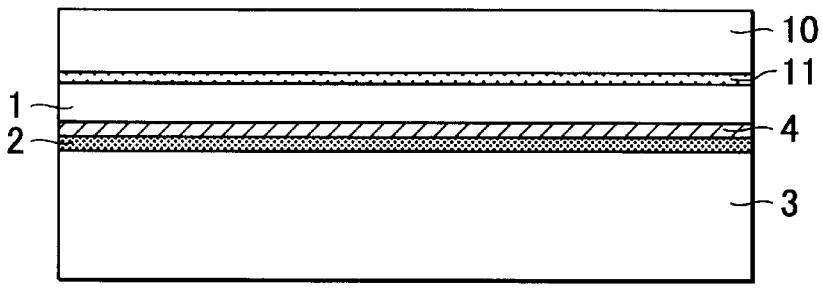

With the silicon thin film 1 overlaid on the ceramic support substrate 3, heating at 500° C. to 1100° C. or anodic welding is used to bond the silicon thin film 1 to the ceramic support substrate 3. In this process, as shown in FIG. 1(c), boron in the silica glass formed on the intermediate layer is diffused into the silicon thin film 1, forming a high-concentration impurity ($p^+$) layer 4. The preferred concentration of the high-concentration impurity layer 4 is $1 \times 10^{18}$ to $1 \times 10^{21}$ cm$^{-3}$, and the preferred diffusion depth in the silicon thin film 1 is one that is within the range 0.1 to 1.0 $\mu$m.

The temperature and time of the baking for removing the resin and the temperature and time of the adhering of the silicon thin film on the support substrate are adjusted by adjusting the content of the lead oxide, barium oxide, aluminum oxide and zinc oxide in the silica glass of the intermediate layer 2. The support substrate 3 should be formed of a material having an expansion coefficient that is close to that of silicon and that has a high diffusion reflectivity. The diffusion reflectivity of the support substrate 3 can be increased by roughening the support substrate surface. Next, the substrate 10 and porous silicon layer 11 are removed, resulting in the layer structure shown in FIG. 1(d) comprising the silicon thin film 1, impurity layer 4, intermediate layer 2 and ceramic support substrate 3. Heat treatment can then be used to further adjust the concentration and depth of the impurity layer 4.

Figure 1D:
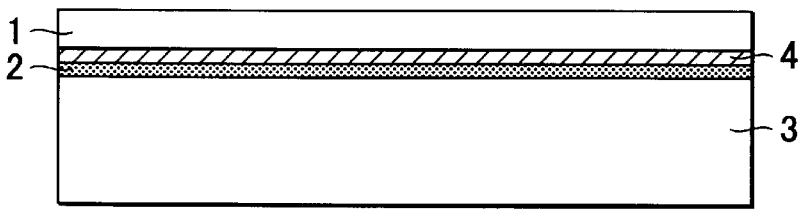
Figure 1E:
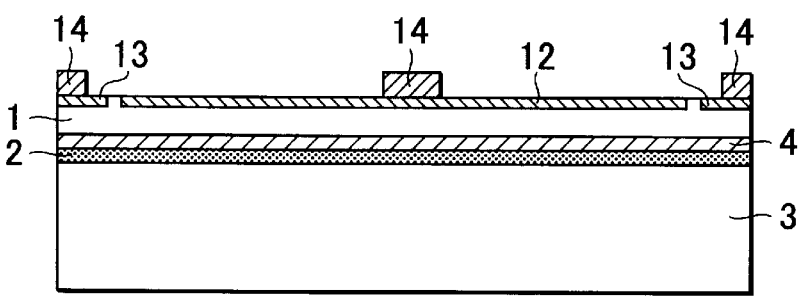

As shown in FIG. 1(e), thermal diffusion or chemical vapor deposition is then used to form an $n^+$ region 12 having a concentration of $2 \times 10^{19}$ cm$^{-3}$ and a $p^+$ region 13 having a concentration of $1 \times 10^{20}$ cm$^{-3}$ on the silicon thin film 1 of the layer structure thus fabricated, and each is then provided with electrodes 14 to complete a solar cell having a BSF layer. The electrodes 14 can be formed of aluminum or silver, or a three-layer structure of titanium/palladium/silver.

Figure 1F:
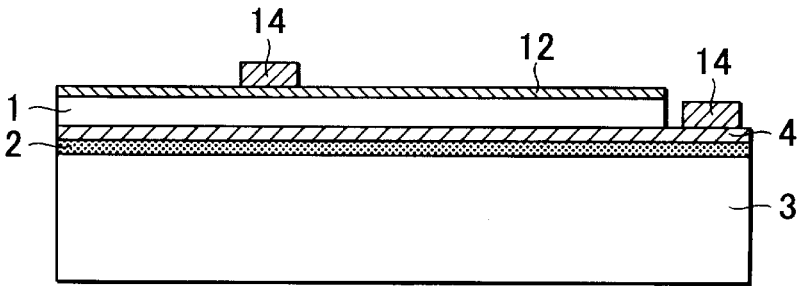

The impurity layer 4 can also be used as a back side electrode layer, enabling the fabrication of a solar cell having the structure shown in FIG. 1(f). That is, from the layer structure of FIG. 1(d), $n^+$ region 12 is formed, an electrode 14 is formed on the impurity layer 4 where a portion of the silicon thin film 1 has been removed, and an electrode 14 is also formed on the $n^+$ region 12. The high-concentration impurity layer 4 acts as a back side field layer that suppresses carrier recombination, helping to elevate the efficiency of the solar cell. In this case it is necessary for the impurity layer 4 to have the opposite conductivity to that of the $n^+$ region 12, meaning $p^+$ conductivity. If the impurity layer 4 has $n^+$ conductivity, the region 12 can be fabricated to have $p^+$ conductivity.

FIG. 2 shows the steps of the method of manufacturing a solar cell according to a second embodiment of the invention, by depositing a silicon thin film directly onto the high-concentration impurity diffusion layer. FIG. 2(a) shows an intermediate layer 2 formed on the support substrate 3. The intermediate layer 2 is a boron-containing oxide film formed by the CVD method, which is also used to form silicon thin film 1 on the intermediate layer 2.

Figure 2A:
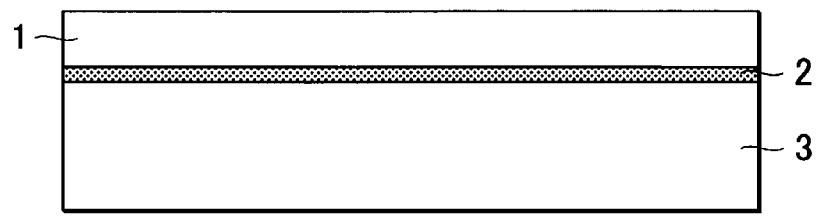
FIGS. 2(a) to (d) show the steps of the method of manufacturing a solar cell according to a second embodiment of the invention.
Figure 2B:
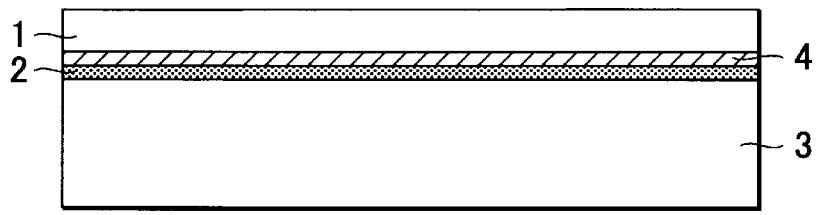

This is followed by heat-treatment at 500° C. to 1500° C., forming a high-concentration impurity layer 4 in the silicon thin film 1, as shown in FIG. 2(b). In addition to the usual methods, the heat treatment can be applied using a lamp, laser beam or electron beam. The heat treatment diffuses the boron in the intermediate layer 2 oxide film into the silicon thin film 1, forming an impurity layer 4 having a high concentration of $1 \times 10^{18}$ to $1 \times 10^{21}$ cm$^{-3}$. The impurity layer 4 is a $p^+$ region.

Figure 2C:
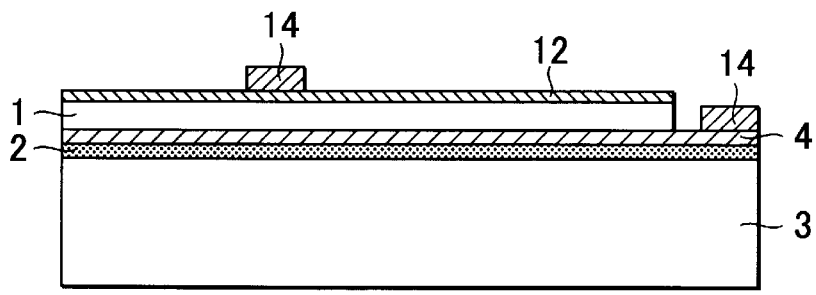
Figure 2D:
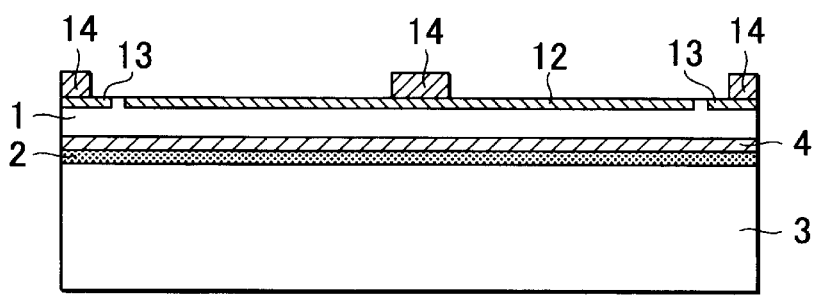

In this way, the same layer structure as that of the first embodiment shown in FIG. 1(d) can be fabricated. The solar cell shown in FIGS. 2(c) and 2(d) can then be fabricated in the same way as in the case of FIGS. 1(f) and 1(e). That is, with respect to the solar cell shown in FIG. 2(d), the CVD method is used to form an $n^+$ region 12 and a $p^+$ region 13 on the silicon thin film 1 of the layer structure, and electrodes 14 are then formed. As shown in FIG. 2(c), a solar cell can be fabricated having a structure in which the impurity layer 4 formed where a portion of the silicon thin film 1 has been removed can be used as a back side electrode layer.

The method of manufacturing a solar cell according to this invention comprises providing an intermediate layer containing an impurity between a silicon thin film and a support substrate, using heat treatment to diffuse the impurity from the intermediate layer into the silicon thin film to form a high-concentration impurity layer in the silicon thin film. Thus, a back side field layer and back side electrode layer can be formed without having to diffuse a high-concentration impurity layer before adhering the silicon thin film and without additional steps, helping to achieve a solar cell that has enhanced efficiency costs less.

What is claimed is:

1. A method of manufacturing a solar cell comprising the steps of interposing an intermediate layer containing p-type or n-type impurity between a silicon thin film and a support substrate, and subjecting all or part of the structure thus formed to heat treatment at 500° C. to 1500° C. to diffuse the intermediate layer impurity into the silicon thin film to form a high-concentration impurity layer in the silicon thin film, wherein the intermediate layer is incorporated into the solar cell; and the interposing comprises forming the silicon thin film on a silicon substrate or other substrate, and then adhering the silicon thin film directly to the intermediate layer.

2. The method according to claim 1, wherein concentration of the high-concentration impurity layer is $1 \times 10^{18}$ to $1 \times 10^{21}$ cm$^{-3}$.

3. The method according to claim 1, wherein the silicon thin film is single-crystal or polycrystal silicon up to 100 $\mu$m thick.

4. The method according to claim 1, wherein the impurity contained in the intermediate layer is a group III element or a compound thereof, or a group V element or a compound thereof.

5. The method according to claim 1, wherein the interposing comprises forming the silicon thin film on a silicon substrate or other substrate, forming the intermediate layer on another substrate, and then adhering the silicon thin film directly to the intermediate layer.

* * * * *